(12) United States Patent
Niyama et al.

(10) Patent No.: US 8,072,002 B2
(45) Date of Patent: Dec. 6, 2011

(54) FIELD EFFECT TRANSISTOR

(75) Inventors: Yuki Niyama, Tokyo (JP); Seikoh Yoshida, Tokyo (JP); Hiroshi Kambayashi, Tokyo (JP); Takehiko Nomura, Tokyo (JP); Masayuki Iwami, Kanagawa (JP); Shinya Ootomo, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 144 days.

(21) Appl. No.: 12/382,941

(22) Filed: Mar. 26, 2009

(65) Prior Publication Data

US 2009/0242938 A1 Oct. 1, 2009

(30) Foreign Application Priority Data

Mar. 31, 2008 (JP) ................................. 2008-094030

(51) Int. Cl.
*H01L 29/66* (2006.01)
(52) U.S. Cl. ................................. 257/194; 257/E29.246
(58) Field of Classification Search .................. 257/194, 257/E28.246
See application file for complete search history.

(56) References Cited

U.S. PATENT DOCUMENTS 6,552,373 B2 * 4/2003 Ando et al. .................... 257/192
7,038,253 B2 * 5/2006 Yoshida et al. ............... 257/192

FOREIGN PATENT DOCUMENTS

JP 2005-159117 A * 6/2005
WO WO-03-071607 8/2003

OTHER PUBLICATIONS

M. Kuraguchi et al., "Normally-off GaN-MISFET with well-controlled threshold voltage", International Workshop on Nitride Semiconductors 2006 (IWN 2006), Oct. 22-27, 2006, Kyoto, Japan, WeED1-4.
Huang W, Khan T, Chow T P: Enhancement-Mode n-Channel GaN MOFETs on p and n-GaN/Sapphire substrates. In: 18th International Symposium on Power Semiconductor Devices and ICs (ISPSD) 2006 (Italy), 10-1.

* cited by examiner

*Primary Examiner* — Zandra Smith
*Assistant Examiner* — Paul Patton
(74) *Attorney, Agent, or Firm* — Lowe, Hauptman, Ham & Berner, LLP (57) ABSTRACT

A field effect transistor formed of a semiconductor of a III group nitride compound, includes an electron running layer formed on a substrate and formed of GaN; an electron supplying layer formed on the electron running layer and formed of $Al_xGa_{1-x}N$ ($0.01 \leq x \leq 0.4$), the electron supplying layer having a band gap energy different from that of the electron running layer and being separated with a recess region having a depth reaching the electron running layer; a source electrode and a drain electrode formed on the electron supplying layer with the recess region in between; a gate insulating film layer formed on the electron supplying layer for covering a surface of the electron running layer in the recess region; and a gate electrode formed on the gate insulating film layer in the recess region. The electron supplying layer has a layer thickness between 5.5 nm and 40 nm.

19 Claims, 6 Drawing Sheets

FIELD EFFECT TRANSISTOR

BACKGROUND

1. Technical Field

The present invention relates to a field effect transistor made of a group III nitride semiconductor.

2. Related Art

A MOSFET (Metal-Oxide-Semiconductor Field Effect Transistor) using GaN material and a HEMT (High Electron Mobility Transistor) using AlGaN/GaN material are known as field effect transistors using a group III nitride semiconductor, as shown by Non-Patent Documents 1 and 2 and Patent Document 1, for example. These devices have higher dielectric breakdown voltage (referred to hereinafter as "withstand voltage") and higher saturation mobility (referred to hereinafter as "mobility") than field effect transistors using other group III compound semiconductor materials such as Si, GaAs, and InP. Furthermore, these devices perform normally-off operation, and are therefore suitable for power devices.

Non-Patent Document 1: M. Kuraguchi et al., "Normally-off GaN-MISFET with well-controlled threshold voltage", International Workshop on Nitride Semiconductors 2006 (IWN2006), Oct. 22-27, 2006, Kyoto, Japan, WeED1-4.

Non-Patent Document 2: Huang W, Khan T, Chow T P: Enhancement-Mode n-Channel GaN MOFETs on p and n-GaN/Sapphire substrates. In: 18th International Symposium on Power Semiconductor Devices and ICs (ISPSD) 2006 (Italy), 10-1.

Patent Document 1: International Publication WO 2003/071607

Among conventional GaN MOSFETs, devices have been announced that have high mobilities of 167 $cm^2/Vs$ or high withstand voltages near 1000 V, but a field effect transistor that has both high mobility and high withstand voltage has yet to be realized.

In light of this, it is an objective of the present invention to provide a normally-off field effect transistor that has both high mobility and high withstand voltage

SUMMARY

In order to solve the above problems, the present invention provides a field effect transistor formed of a semiconductor of a group III nitride compound, comprising an electron transit layer formed on a substrate and formed of GaN; an electron supplying layer formed on the electron transit layer and formed of $Al_xGa_{1-x}N$ ($0.01 \leq x \leq 0.4$), said electron supplying layer having a band gap energy different from that of the electron transit layer and being divided with a recess region having a depth reaching the electron transit layer; a source electrode and a drain electrode formed on the electron supplying layer with the recess region therebetween; a gate insulating film formed on the electron supplying layer for covering a surface of the electron transit layer in the recess region; and a gate electrode formed on the gate insulating film in the recess region. The electron supplying layer has a thickness no less than 5.5 nm and no greater than 40 nm.

In the field effect transistor, the electron transit layer contains one of Mg, Be, Zn and C as an acceptor.

In the field effect transistor, the electron transit layer contains an acceptor at an addition density of no less than $1 \times 10^{15}$ $cm^{-3}$ and no greater than $5 \times 10^{17}$ $cm^{-3}$.

In the field effect transistor, the electron transit layer comprises a lower layer and an upper layer formed on the lower layer and having a density of an acceptor different from that of the lower layer, said recess region having the depth reaching to the lower layer.

In the field effect transistor, the electron supplying layer directly under the drain electrode includes a step structure formed of no more than three steps, the step structure having a thickness decreasing from the drain electrode side toward the gate electrode side.

In the field effect transistor, the electron supplying layer directly under the drain electrode further comprises a drain side region on the drain electrode side and a gate side region on the gate electrode side having a thickness smaller than that of the drain side region, the drain side region having a thickness such that a sheet carrier density of a two dimensional electron gas formed at an interface in the electron transit layer becomes between $6 \times 10^{12}$ $cm^{-2}$ and $8 \times 10^{12}$ $cm^{-2}$, the gate side region having a thickness such that the sheet carrier density of the two dimensional electron gas formed at the interface in the electron transit layer becomes between $2 \times 10^{12}$ $cm^{-2}$ and $4 \times 10^{12}$ $cm^{-2}$.

In the field effect transistor, the electron supplying layer directly under the drain electrode comprises a plurality of regions having a composition ratio of Al decreasing from the drain electrode side toward the gate electrode side.

The present invention can provide a normally-off field effect transistor with both high mobility and high withstand voltage.

DESCRIPTION OF EXEMPLARY EMBODIMENTS

The following describes specific embodiments of the field effect transistor according to the present invention, with reference to drawings. The present invention is not limited to the embodiments described below. In the drawings described below, identical or corresponding components are given the same reference numerals.

First Embodiment

Figure 1:
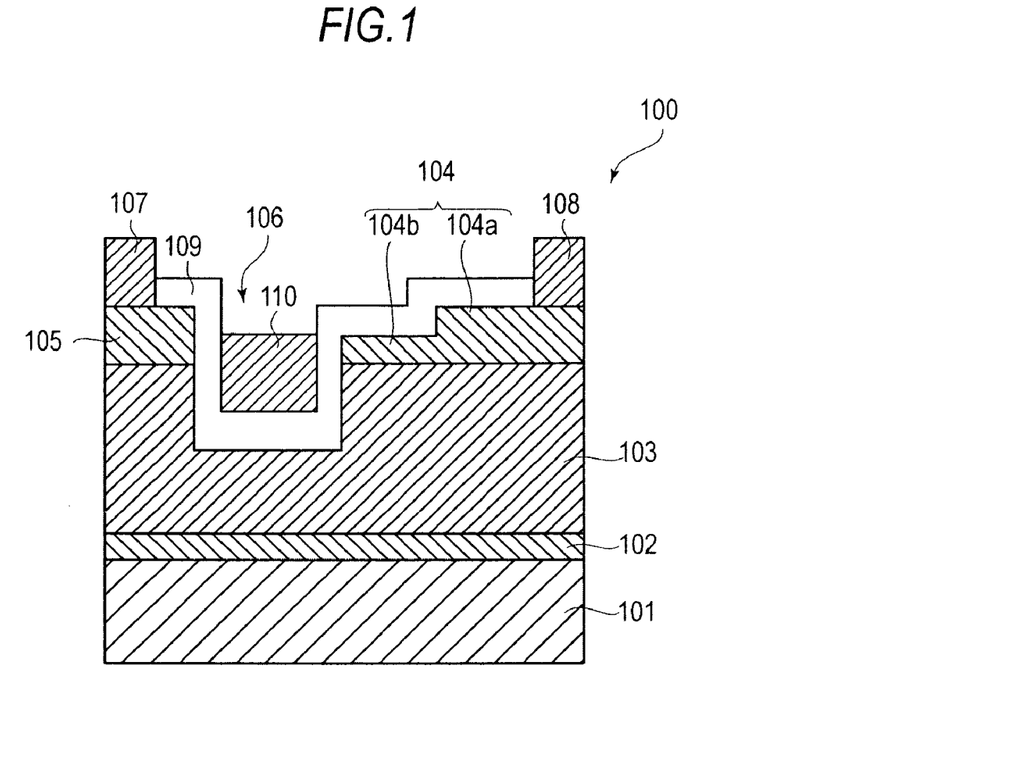
FIG. 1 is a schematic cross-sectional view of a MOSFET according to the First Embodiment of the present invention.

FIG. 1 is a schematic cross-sectional view of a MOSFET according to the First Embodiment of the present invention. As shown in FIG. 1, this MOSFET 100 includes an electron transit layer 103 made of undoped GaN and formed on a substrate 101, which is made of sapphire, SiC, $ZrB_2$, Si, or the like, with a buffer layer 102 therebetween. The buffer layer 102 is obtained by stacking eight layers of GaN/AlN composite layers with thicknesses of 200 nm/20 nm, for example. The electron transit layer 103 has a thickness of approximately 2 μm.

The MOSFET 100 further includes electron supplying layers 104 and 105 formed on the electron transit layer 103. The electron supplying layers 104 and 105 are made of $Al_xGa_{1-x}N$ ($0.01 \leq x \leq 0.4$), which has different band gap energy than the electron transit layer 103, thereby forming a so-called modulation-doped structure. The composition of the $Al_xGa_{1-x}N$ layer is kept within the above range because two-dimensional electron gas is generated by the formation of a band offset in the heterojunction interface between the $Al_xGa_{1-x}N$ layer and the GaN layer. The electron supplying layers 104 and 105 are separated from each other by a recess region 106 formed to have a depth reaching the electron transit layer 103. The recess region 106 may have a width of approximately 2 μm and a depth of approximately 60 nm, as measured from the top surfaces of the electron supplying layers 104 and 105, for example.

The MOSFET 100 further includes a source electrode 107 and a drain electrode 108 formed on the electron supplying layers 104 and 105 to sandwich the recess region 106. The MOSFET 100 includes a gate insulating film 109 made of $SiO_2$ or the like and formed across the electron supplying layers 104 and 105 to cover the surface of the electron transit layer 103 within the recess region 106, and a gate electrode 110 that is formed on the gate insulating film 109 within the recess region 106. The space between the source electrode 107 and the drain electrode 108 is approximately 30 μm, for example.

In the MOSFET 100, the electron supplying layer 104 positioned directly below the drain electrode 108 includes a drain side region 104a that is positioned on the drain electrode 108 side and a gate side region 104b that is positioned on the gate electrode 110 side and thinner than the drain side region 104a. In other words, the electron supplying layer 104 has a two-step structure in which the thickness of the electron supplying layer 104 decreases from the drain electrode 108 side to the gate electrode 110 side. The drain side region 104a and the gate side region 104b each have a thickness in a range from 5.5 nm to 40 nm. By setting the thickness of the electron supplying layer within the range from 5.5 to 40 nm, the amount of two-dimensional electron gas can be kept in a range from $3\times10^{12}/cm^2$ to $7\times10^{12}/cm^2$. The thickness of the electron supplying layer 105 is approximately the same as that of the drain side region 104a.

Figure 2:
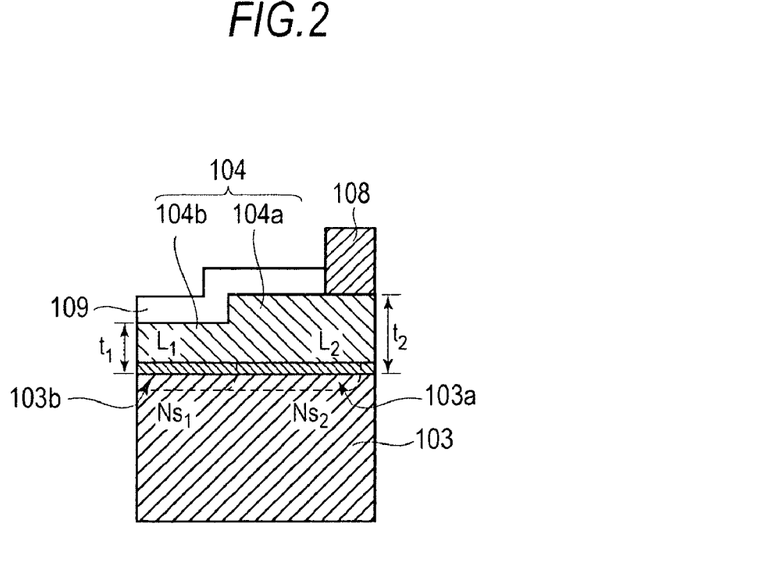
FIG. 2 shows the electron supplying layer and the surrounding region.

FIG. 2 shows the electron supplying layer 104 and the surrounding region. As shown in FIG. 2, the thickness of the drain side region 104a is $t_2$ and the length is $L_2$. The thickness of the gate side region 104b is $t_1$ and the length is $L_1$. High-mobility two-dimensional electron gases 103a and 103b are generated below the drain side region 104a and the gate side region 104b in the electron transit layer 103 near the interface between the electron transit layer 103 and the electron supplying layer 104, due to the band gap energy difference between the $Al_xGa_{1-x}N$ forming the electron supplying layer 104 and the GaN forming the electron transit layer 103. The densities of the two-dimensional electron gases 103a and 103b are respectively $Ns_1$ and $Ns_2$.

Figure 3:
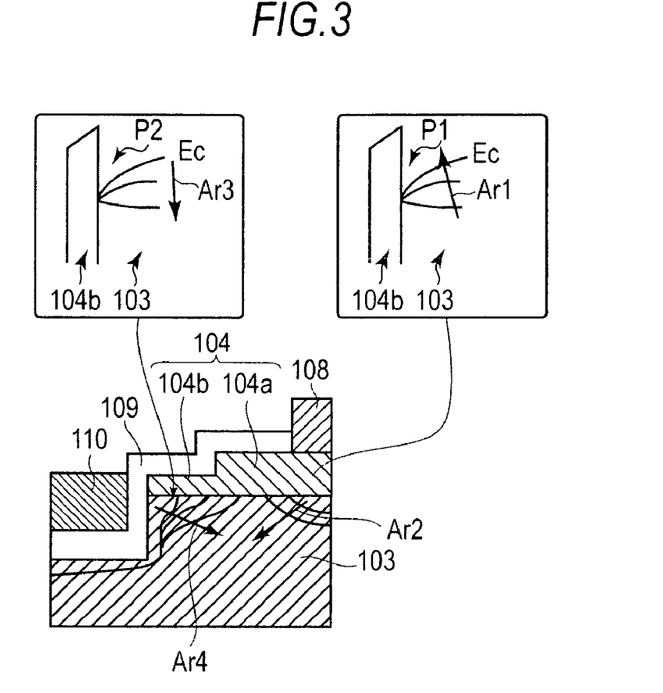
FIG. 3 shows the change in the depletion layer when the drain voltage is applied to the MOSFET.

The following describes a change in a depletion layer when a drain voltage is applied to the MOSFET 100. FIG. 3 shows the change in the depletion layer when the drain voltage is applied to the MOSFET 100. FIG. 3 shows the electron supplying layer 104 and the surrounding region, along with the potential Ec of the conduction band near the interface between the electron transit layer 103 and the electron supplying layer 104.

First, the change in the depletion layer of the drain side region 104a will be described. When the gate voltage and drain voltage are 0 V, a triangular potential P1 is formed at the interface between the electron transit layer 103 and the drain side region 104a. In this state, the drain voltage is applied while the gate voltage is kept at 0 V. As this drain voltage is gradually increased, the potential of the conduction band decreases because the potential on the drain side region 104a side increases. As a result, the potential of the conduction band in the electron transit layer 103 increases as shown by the arrow Ar1, thereby pinching off the two-dimensional electron gas near the interface and eliminating the electrons, which causes the depletion layer to extend toward the gate side as shown by the arrow Ar2.

Next, the change in the depletion layer of the gate side region 104b will be described. When the gate voltage and drain voltage are 0 V, the MOS formed by the gate electrode 110, the gate insulating film 109, and the electron transit layer 103 is in an accumulation mode. In this state, the drain voltage is applied while the gate voltage is kept at 0 V. As this drain voltage is gradually increased, the potential of the conduction band decreases as shown by the arrow Ar3, due to the increase in the potential on the electron transit layer 103 side. As a result, the depletion layer extends toward the drain side as shown by the arrow Ar4.

In other words, since the depletion layer extends from the drain side and the gate side at the interface between the electron transit layer 103 and the electron supplying layer 104 in the MOSFET 100, a high withstand voltage can be realized. In recent results, the length between the gate and drain was adjusted to realize a withstand voltage of 100 V/μm. Furthermore, since the two-dimensional electron gas is used as a carrier, a high mobility of no less than 1000 $cm^2/Vs$ is realized. Since the electron transit layer 103 is undoped GaN, normally-off operation is also realized.

Furthermore, because the gate side region 104b is thinner than the drain side region 104a in the MOSFET 100, the densities of the two-dimensional electron gases 103a and 103b directly below the drain side region 104a and gate side region 104b are such that $Ns_1 < Ns_2$. As a result, a 2-zone RESURF (REduced SURface Field) region is formed, and the densities $Ns_1$ and $Ns_2$ are such that the pinching off of the two-dimensional electron gas in the drain side region 104a is accelerated and the extension of the depletion layer of the gate side region 104b is also accelerated at the same time, thereby forming a MOSFET with a higher withstand voltage.

Concerning the densities $Ns_1$ and $Ns_2$ of the two-dimensional electron gases 103a and 103b, a high withstand voltage can be realized if $Ns_1 < Ns_2$, but in order to realize high withstand voltage, the density $Ns_1$ is preferably from $2\times10^{12}$ $cm^{-2}$ to $4\times10^{12}$ $cm^{-2}$, more preferably approximately $3\times10^{12}$ $cm^{-2}$, and the density $Ns_2$ is preferably from $6\times10^{12}$ $cm^{-2}$ to $8\times10^{12}$ $cm^{-2}$, more preferably approximately $7.5\times10^{12}$ $cm^{-2}$. Concerning the length $L_1$ of the gate side region 104b and the length $L_2$ of the drain side region 104a, lengths of $L_1$=12 μm and $L_2$=8 μm are preferable for obtaining a high withstand voltage.

Figure 4:
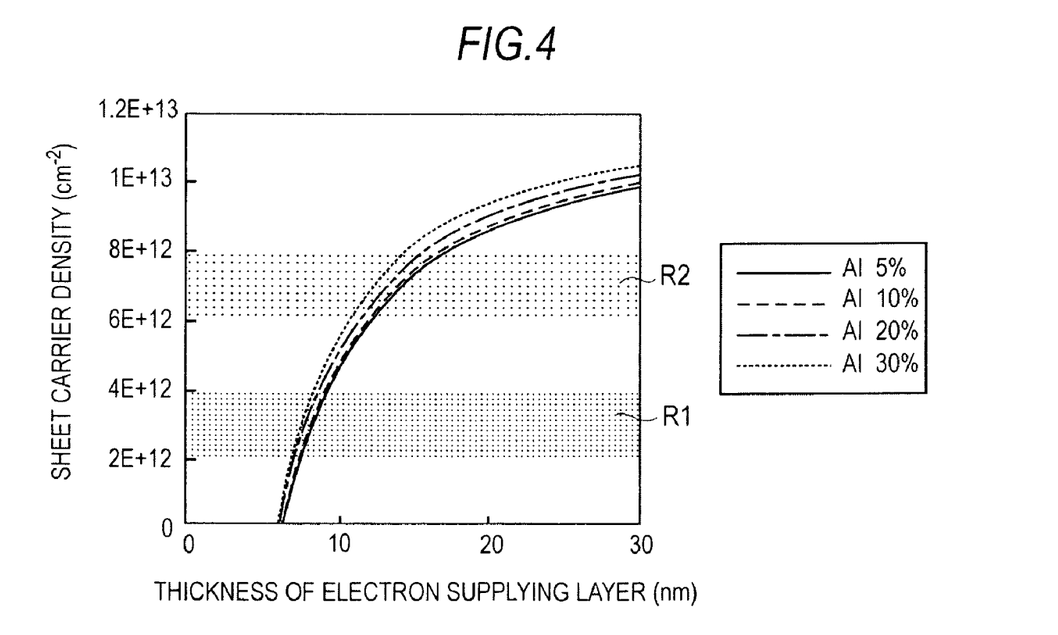
FIG. 4 shows a relationship between the thickness of electron supplying layers having different Al composition ratios and sheet carrier densities of the two-dimensional electron gases.

The above densities $Ns_1$ and $Ns_2$ can be achieved by setting a suitable thickness for the electron supplying layer 104 and a suitable Al composition ratio x for the $Al_xGa_{1-x}N$ forming the electron supplying layer 104. FIG. 4 shows a relationship between the thickness of electron supplying layers 104 having different Al composition ratios and sheet carrier densities of the two-dimensional electron gases. The ranges R2 and R1 indicate the preferable ranges of the $Ns_2$ and $Ns_1$ densities. As shown in FIG. 2, the sheet carrier densities depend mainly on the thickness of the electron supplying layer 104. For example, when the Al composition ratio x is 0.2, preferable values for the densities $Ns_1$ and $Ns_2$ can be realized by setting the thickness t1 of the gate side region 104b in a range of 7.5 nm to 8.8 nm and setting the thickness t2 of the drain side region 104a in a range of 11.0 to 16.0 nm.

Figure 5:
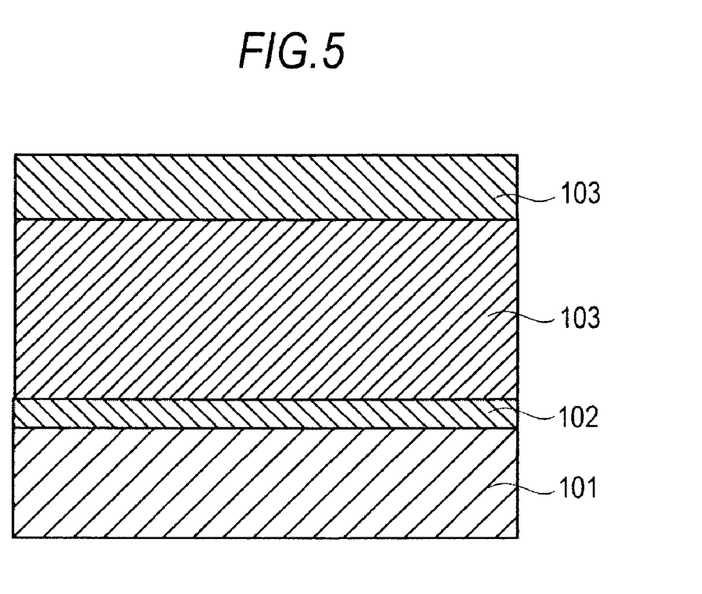
FIG. 5 is used to describe an exemplary method for manufacturing the MOSFET shown in FIG. 1.
Figure 6:
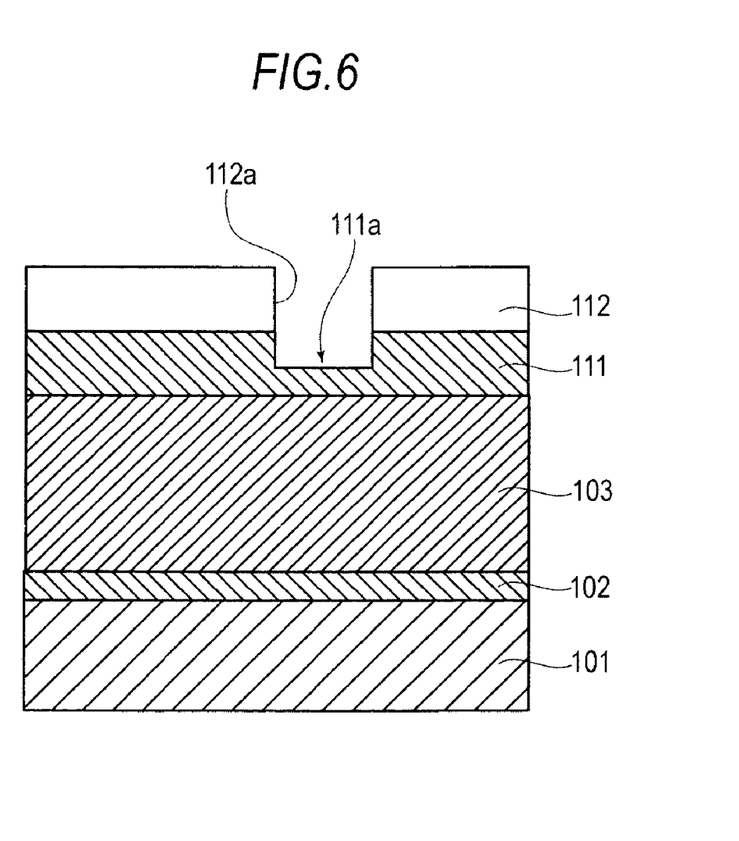
FIG. 6 is used to describe an exemplary method for manufacturing the MOSFET shown in FIG. 1.
Figure 7:
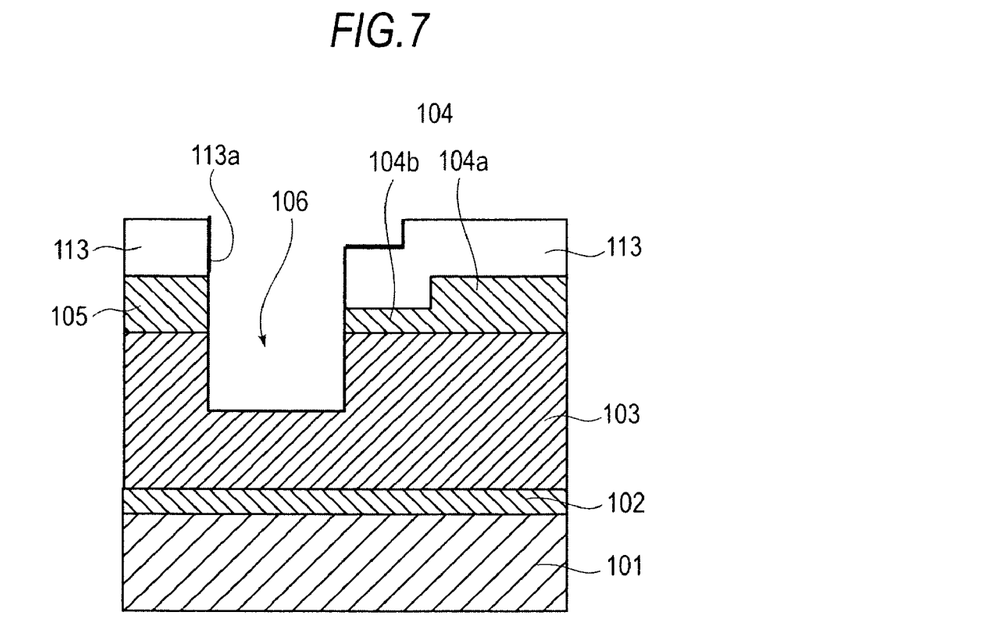
FIG. 7 is used to describe an exemplary method for manufacturing the MOSFET shown in FIG. 1.

The following describes a method for manufacturing the MOSFET 100. FIGS. 5 to 7 are used to describe an exemplary method for manufacturing the MOSFET 100. The following describes an example in which metal organic chemical vapor deposition (MOCVD) is used to grow the semiconductor layers, but the method used is not limited to this. For example, hydride vapor phase epitaxy (HVPE) or molecular beam epitaxy (MBE) may be used instead.

First, as shown in FIG. 5, the buffer layer 102 and the electron transit layer 103 are sequentially epitaxially grown on the substrate 101, which may be made of Si and have a principal surface in the plane (111). Next, in order to form the electron supplying layers 104 and 105, an AlGaN layer 111 with an Al composition ratio of 0.2, for example, is epitaxially grown on the electron transit layer 103 to a thickness, e.g. 30 nm, corresponding to the thickness of the drain side region 104a. When growing the AlGaN layer 111, Si is added as an n-type impurity with a density of approximately $1\times10^{17}$ cm$^{-3}$, using silane, for example. Next, a photoresist is applied to the surface of the AlGaN layer 111 and an element isolation pattern is formed using photolithography. After this, dry etching, such as reactive ion etching (RIE), is used to form an element isolation trench, not shown, with a depth of approximately 200 nm. After this, the photoresist is removed using acetone.

Next, as shown in FIG. 6, plasma-enhanced chemical vapor deposition (PECVD), for example, is used to form an $SiO_2$ mask layer 112 with a thickness of 300 nm on the AlGaN layer 111, patterning is performed using photolithography, and an opening 112a is formed in a region where the gate side region 104b is to be formed using a hydrofluoric acid solution. After this, a dry etching apparatus is used to etch a depth of 20 nm in the AlGaN layer 111 within the opening 112a, thereby forming the thin portion 111a corresponding to the gate side region 104b. A hydrofluoric acid solution is then used to remove the mask layer 112.

Next, as shown in FIG. 7, PECVD, for example, is used to form an $SiO_2$ mask layer 113 with a thickness of 300 nm over the entire surface, patterning is performed using photolithography, and the opening 113a is formed in the region where the recess region 106 is to be formed using a hydrofluoric acid solution. After this, a dry etching apparatus is used to etch a depth of 60 nm in the AlGaN layer 111 and the electron transit layer 103 within the opening 113a, thereby forming the recess region 106. By forming this recess region, the AlGaN layer 111 is separated to form the electron supplying layers 104 and 105. A hydrofluoric acid solution is then used to remove the mask layer 113.

Next, PECVD is used to form an $SiO_2$ gate insulating film 109 with a thickness of 60 nm over the electron supplying layer 104 and the electron supplying layer 105 to cover the surface of the electron transit layer 103 in the recess region 106. A portion of the gate insulating film 109 is then removed using a hydrofluoric acid solution, and a lift-off prcoess is used to form the drain electrode 108 and the source electrode 107 respectively on the electron supplying layer 104 and the electron supplying layer 105. The drain electrode 108 and the source electrode 107 achieve ohmic contact with the electron supplying layers 104 and 105, and may be made of Ti/Al with a thickness of 25 nm/300 nm, for example. The deposition of the metal film that becomes the electrodes can be achieved using sputtering or vacuum deposition. After forming the source electrode 107 and the drain electrode 108, the resulting structure is annealed for 10 minutes at 600° C.

Next, sputtering or low pressure chemical vapor deposition (LPCVD), for example, is used to form poly-Si over the entire surface. A thermal diffusion furnace containing $POCl_3$ gas is then used to dope P in the poly-Si using thermal diffusion by applying thermal processing at 900° C. for 20 minutes. The doping source may be P deposited on the surface. Next, a lift-off process is applied to the poly-Si to form the gate electrode 110, thereby completing the MOSFET 100 shown in FIG. 1. The gate electrode 110 may be formed of Au, Pt, Ni, or the like using lithography.

As described above, the MOSFET 100 according to the First Embodiment is a normally-off MOSFET with high mobility and high withstand voltage.

Second Embodiment

The following describes the Second Embodiment of the present invention. In the MOSFET according to the Second Embodiment, the electron transit layer includes a lower layer and an upper layer, which each have a different concentration of Mg added thereto.

Figure 8:
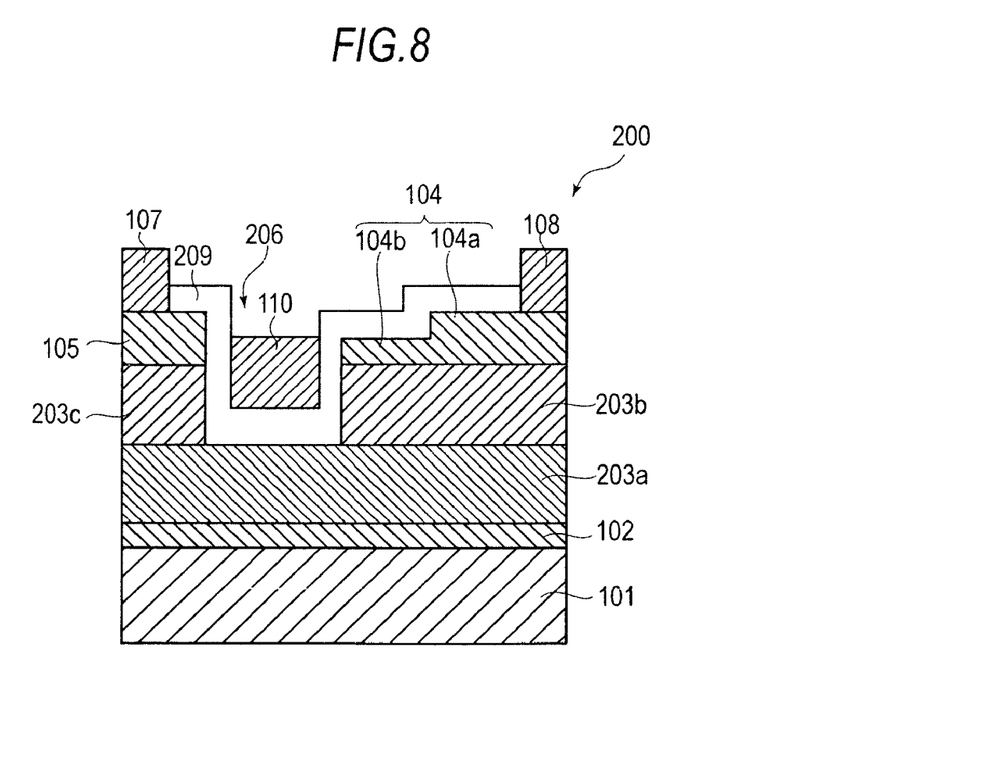
FIG. 8 is a schematic cross-sectional view of the MOSFET according to the Second Embodiment.

FIG. 8 is a schematic cross-sectional view of the MOSFET according to the Second embodiment. The MOSFET 200 differs from the MOSFET 100 of the First Embodiment in that the electron transit layer 103 is replaced by a structure including the lower layer 203a and upper layers 203b and 203c, and the recess region 206 and the gate insulating film 209 have replaced corresponding components. The recess region 206 is formed to have a depth reaching the lower layer 203a. The gate insulating film 209 is formed to cover the surface of the lower layer 203a in the recess region 206.

The lower layer 203a and the upper layers 203b and 203c are each made of p-GaN to which is added different densities of Mg, which is a p-type dopant. The thickness of the lower layer 203a is approximately 500 nm, and the thicknesses of the upper layers 203b and 203c are each approximately 50 nm.

The MOSFET 200 uses the same structure as the MOSFET 100 for realizing high mobility and high withstand voltage. In addition, forming the lower layer 203a and the upper layers 203b and 203c of p-GaN to which is added different densities of Mg enables the MOSFET 200 to perform normally off operation, to easily realize the desired two-dimensional electron gas density with higher precision, and to achieve a high threshold voltage. Here, Mg is used as the dopant because Mg has a shallower acceptor level than the other group II elements, excluding Be, and is the easiest of the group II elements to activate.

The following provides a detailed explanation. As described above, when the Al composition ratio x in the MOSFET 100 is 0.2, the preferable values for the densities $Ns_1$ and $Ns_2$ described above can be realized if the thickness t1 of the gate side region 104b is from 7.5 nm to 8.8 nm and the thickness t2 of the drain side region 104a is from 11.0 nm to 16.0 nm. However, when dry etching is used to obtain the desired thickness of the gate side region 104b, it is necessary to strictly control the etching depth.

In the MOSFET 200, on the other hand, forming the upper layers 203b and 203c of p-GaN to which Mg is added increases the allowable error in the thickness of the gate side region 104b and drain side region 104a necessary to realize the desired densities $Ns_1$ and $Ns_2$.

Specifically, when the electron supplying layer and the electron transit layer have an AlGaN/GaN structure, the charge neutrality condition shown in Expression 1 is established.

$$\rho^+ + N_D^+ = \rho^- + N_{2D}^-$$ Expression 1

In Expression 1, $\rho^+$ and $\rho^-$ represent the charges that occur due to the positive and negative piezo polarization, $N_D^+$ represents the donor density of the AlGaN layer, and $N_{2D}^-$ represents the density of the two-dimensional electron gas. In Expression 1, the left side indicates the charge on the AlGaN layer side and the right side represents the charge on the GaN layer side, and the charge neutrality condition is satisfied such that a boundary condition is established at the interface.

Next, when Mg is added to the GaN layer, the charge neutrality condition is shown by Expression 2 below.

$$\rho^+ + N_D^+ = \rho^- + N_{2D}^- + N_A^-$$ Expression 2

Here, $N_A^-$ represents the acceptor ion density caused by the Mg, and $\rho^+$, $N_D^+$, and $\rho^-$ are the same values in Expressions 1 and 2. Therefore, $N_{2D}^-$ decreases as a result of the increase in $N_A^-$ due to the addition of Mg.

Figure 9:
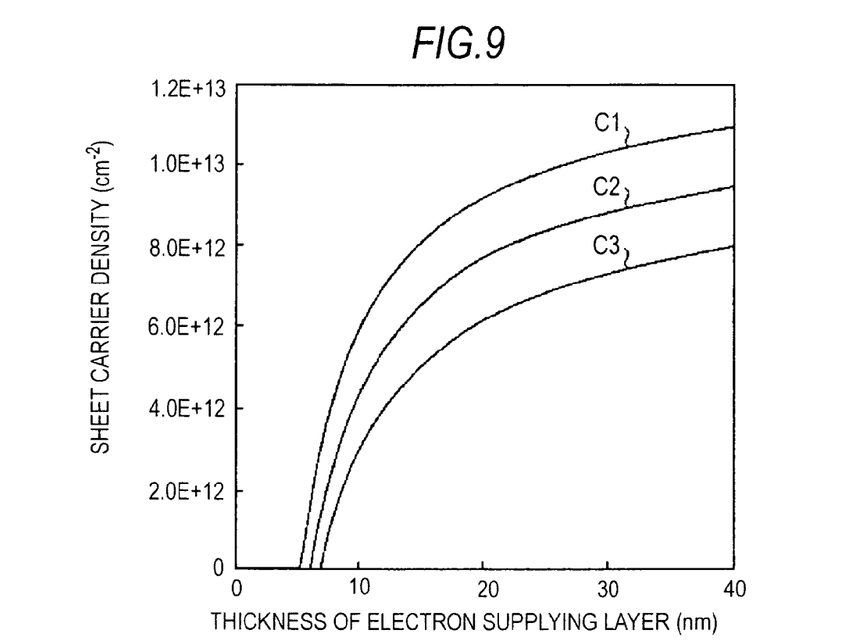
FIG. 9 shows the relationship between the sheet carrier density of the two-dimensional electron gas and the thickness of the electron supplying layer when the electron transit layer is GaN that is undoped or includes Mg.

FIG. 9 shows the relationship between the sheet carrier density of the two-dimensional electron gas and the thickness of the electron supplying layer when the electron transit layer is GaN that is undoped or includes Mg. In FIG. 9, the Al composition ratio x of the electron supplying layer is 0.35. In FIG. 9, C1 is the curve obtained when the electron transit layer is undoped GaN, and C2 and C3 are curves obtained when the electron transit layer is GaN containing Mg and has a thickness of 1 μm and 2 μm, respectively. In FIG. 9, Mg is added to the electron transit layer with a practically uniform density, and the acceptor ion density is $1.5 \times 10^{16}$ cm$^{-3}$. As shown in FIG. 9, when the electron transit layer includes Mg, the sheet carrier density shows an overall decrease compared to a case in which the electron transit layer is undoped, and the change in the density as a result of a change in the thickness is more gradual. Accordingly, when the electron transit layer includes Mg, the amount of change in the sheet carrier density as a result of manufacturing errors or the like in the thickness of the electron supplying layer is decreased, thereby increasing the allowable error in the thickness of the electron supplying layer and making manufacturing using etching or the like easier. Furthermore, the value and change rate of the sheet carrier density can be adjusted by changing the thickness of the electron transit layer or the density of Mg added. As a result, the desired two-dimensional electron gas density can be realized more accurately and more easily.

The following example compares the curve C1 of the undoped electron transit layer when the Al composition ratio is 0.35, i.e. 35% Al, to the curve C3 of the electron transit layer having a thickness of 2 μm and doped with Mg such that the acceptor density is $1 \times 10^{17}$/cm$^3$. In this example, if a value from $2 \times 10^{12}$ cm$^{-2}$ to $4 \times 10^{12}$ cm$^{-2}$ is desired for the sheet carrier density, it is necessary to set a thickness from 6.5 nm to 7.5 nm for the electron supplying layer in the case of the curve C1, but in the case of the curve C3, the thickness of the electron supplying layer can be from 8.5 nm to 12.0 nm.

Figure 10:
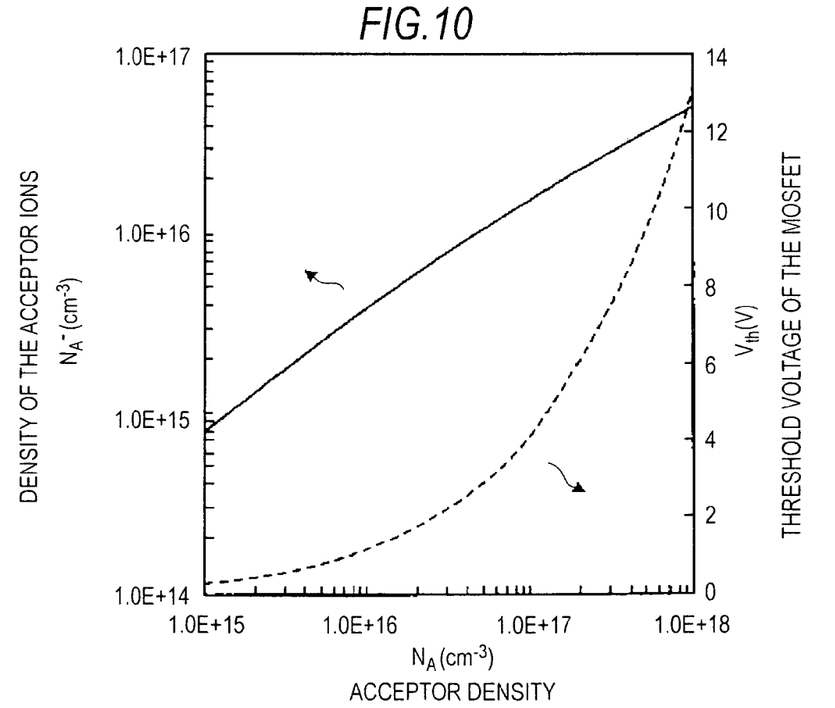
FIG. 10 shows the acceptor density dependency of the acceptor ion density and the threshold voltage.

When the electron transit layer is GaN containing Mg, the density of Mg added, i.e. the acceptor density, and the acceptor ion density caused by the Mg have a prescribed relationship. On the other hand, the threshold voltage of the MOSFET can be uniquely determined by $N_A^-$, which is the acceptor ion density caused by the Mg. Accordingly, the threshold voltage can be changed by adjusting the acceptor density of the Mg. FIG. 10 shows the acceptor density dependency of the acceptor ion density and the threshold voltage. The horizontal axis represents the acceptor density $N_A$, the left side vertical axis represents the acceptor ion density $N_A^-$, and the right side vertical axis represents the threshold voltage $V_{th}$. FIG. 10 shows an example calculated when the gate insulating film has a thickness of 50 nm, the work function of the gate electrode is 4.1 eV, the acceptor level of the Mg is 200 meV, and the temperature is 300 K. As shown in FIG. 10, a threshold voltage of +3 V, which is required for use as a power device, can be realized when the acceptor density is $1 \times 10^{17}$ cm$^{-3}$ and the acceptor ion density is $1.5 \times 10^{16}$ cm$^{-3}$. It should be noted that the threshold voltage is approximately +1 V in conventional AlGaN/GaN HEMTs, and the Second Embodiment realizes a much higher threshold voltage.

In the MOSFET 200 according to the Second Embodiment, the threshold voltage is determined by the acceptor ion density due to the Mg in the lower layer 203a. On the other hand, the sheet carrier density of the two-dimensional electron gas is affected by the acceptor ion density due to the Mg in the upper layers 203b and 203c. Accordingly, in this MOSFET 200, the withstand voltage and the threshold voltage can be independently controlled to be desired values by independently optimizing the density of Mg added to the lower layer 203a and to the upper layers 203b and 203c. From the viewpoint of the withstand voltage and the threshold voltage, when setting the threshold voltage between 3 V and 5 V, the density of Mg added to each of the lower layer 203a and the upper layer 203b is preferably no less than $1 \times 10^{15}$ cm$^{-3}$ and no greater than $5 \times 10^{17}$ cm$^{-3}$.

The MOSFET 200 according to the Second Embodiment can be manufactured using the same method for manufacturing the MOSFET 100 described above. The addition of Mg can be achieved using bis-cyclopentadienyl magnesium (Cp2Mg).

In the MOSFET 200 according to the Second Embodiment, the density of Mg added to the lower layer 203a is different from the density of Mg added to the upper layers 203b and 203c, but the allowable error in the thickness of the electron supplying layer can be increased even if these densities are the same.

In the First and Second Embodiments described above, the electron supplying layer 104 has a stepped structure with two steps, but a three-step structure may be used instead. A stepped structure that has two or three steps can be easily manufactured.

Third Embodiment

Figure 11:
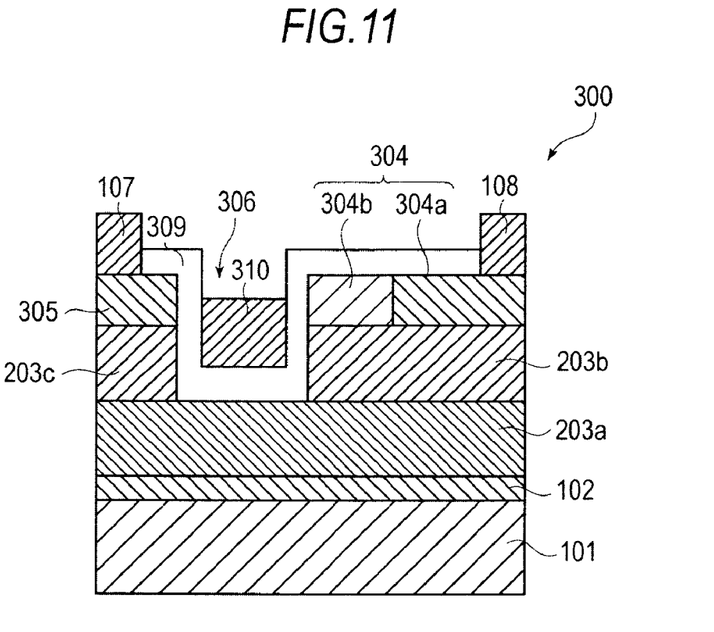
FIG. 11 is a schematic cross-sectional view of the MOSFET according to the Third embodiment.

The following describes the Third Embodiment of the present invention. FIG. 11 is a schematic cross-sectional view of a MOSFET according to the Third Embodiment. In this MOSFET 300, corresponding components in the MOSFET 200 according to the Second Embodiment are replaced with electron supplying layers 304 and 305, a recess region 306, a gate insulating film 309, and a gate electrode 310.

The electron supplying layer 304 is made of $Al_xGa_{1-x}N$ and includes a drain side region 304a positioned on the drain electrode 108 side and a gate side region 304b position on the gate electrode 310 side. The electron supplying layer 305 is made of $Al_xGa_{1-x}N$. The recess region 306 is formed to have a depth reaching the lower layer 203a. The gate insulating film 309 is formed over the electron supplying layers 304 and 305 to cover the surface of the lower layer 203a within the recess region 306. Here, the drain side region 304a and the gate side region 304b have approximately the same thickness, but the Al composition ratio of the gate side region 304b is lower than the Al composition ratio of the drain side region 304a. As a result, a 2-zone RESURF region is formed in the same manner as in the MOSFETs 100 and 200, thereby realizing a MOSFET with high mobility and higher withstand voltage. The Al composition ratios of the drain side region 304a and the gate side region 304b are not particularly limited, and may be in a range from 0.01 to 0.4. For example, the Al composition ratios may respectively be 0.4 and 0.2 for the drain side region 304a and the gate side region 304b. Furthermore, the electron supplying layer 305 has the same thickness and composition ratio as the drain side region 304a, but the thickness and composition ratio are not limited to this.

The MOSFET 300 according to the Third Embodiment can be manufactured using the same method for manufacturing the MOSFET 100 described above. A regrowth technique can be used to form the electron supplying layer 304.

In the MOSFET 300 according to the Third Embodiment, the electron supplying layer 304 includes two regions, but the electron supplying layer may instead include two or more regions in which the Al composition ratio grows smaller in steps from the drain electrode side to the gate electrode side. A structure having 2 or 3 regions can be easily manufactured.

Fourth Embodiment

Figure 12:
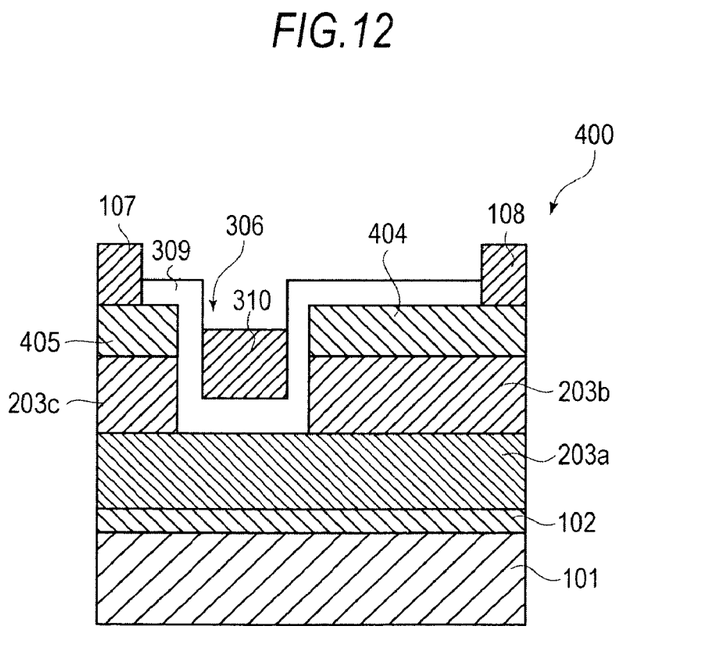
FIG. 12 is a schematic cross-sectional view of the MOSFET according to the Fourth Embodiment.

The following describes the Fourth Embodiment of the present invention. FIG. 12 is a schematic cross-sectional view of a MOSFET according to the Fourth Embodiment. In this MOSFET 400 corresponding components in the MOSFET 300 according to the Third Embodiment are replaced with electron supplying layers 404 and 405.

The electron supplying layers 404 and 405s are each made of $Al_xGa_{1-x}N$ ($0.01 \leq x \leq 0.4$) and have the same thickness in a range from 5.5 to 40 nm. Unlike the MOSFETS 100 to 300, a 1-zone RESURF region is formed in the MOSFET 400. The MOSFET 400 realizes high withstand voltage as a result of the depletion layer extending from the drain side and the gate side at the interface between the upper layer 203b and the electron supplying layer 404. In addition, a high mobility no less than 1000 $cm^2/Vs$ is realized because two-dimensional electron gas is used as the carrier.

What is claimed is:

1. A field effect transistor formed of a semiconductor of a III group nitride compound, comprising:
    an electron running layer formed on a substrate and formed of GaN;
    an electron supplying layer formed on the electron running layer and formed of $Al_xGa_{1-x}N$ ($0.01 \leq x \leq 0.4$), said electron supplying layer having a band gap energy different from that of the electron running layer and being divided with a recess region having a depth reaching the electron running layer;
    a source electrode and a drain electrode formed on the electron supplying layer with the recess region in between;
    a gate insulating film layer formed on the electron supplying layer for covering a surface of the electron running layer in the recess region; and
    a gate electrode formed on the gate insulating film layer in the recess region,
    wherein said electron running layer comprises a lower part layer and an upper part layer formed on the lower part layer and having a density of an acceptor different from that of the lower part layer, said recess region having the depth reaching to the lower part layer.

2. The field effect transistor according to claim 1, wherein said electron running layer contains one selected from the group consisting of Mg, Be, Zn and C as the acceptor.

3. The field effect transistor according to claim 1, wherein the density of the acceptor in said electron running layer is not smaller than $1 \times 10^{15}$ $cm^{-3}$ and not greater than $5 \times 10^{17}$ $cm^{-3}$.

4. A field effect transistor formed of a semiconductor of a III group nitride compound, comprising:
    an electron running layer formed on a substrate and formed of GaN;
    an electron supplying layer formed on the electron running layer and formed of $Al_xGa_{1-x}N$ ($0.01 \leq x \leq 0.4$), said electron supplying layer having a band gap energy different from that of the electron running layer and being divided with a recess region having a depth reaching the electron running layer;
    a source electrode and a drain electrode formed on the electron supplying layer with the recess region in between;
    a gate insulating film layer formed on the electron supplying layer for covering a surface of the electron running layer in the recess region; and
    a gate electrode formed on the gate insulating film layer in the recess region,
    wherein said electron supplying layer under the drain electrode includes a step structure formed of not more than three steps, said step structure having a thickness decreasing from the drain electrode toward the gate electrode.

5. The field effect transistor according to claim 4, wherein said electron supplying layer under the drain electrode further comprises
    a drain side region on a side of the drain electrode and defining a higher step of said step structure, and
    a gate side region on a side of the gate electrode and having a thickness smaller than that of the drain side region to define a lower step of said step structure,
    the thickness of said drain side region being such that a sheet carrier density of a two dimensional electron gas formed at an interface of said drain side region with the electron running layer becomes between $6 \times 10^{12}$ $cm^{-2}$ and $8 \times 10^{12}$ $cm^{-2}$, and
    the thickness of said gate side region being such that the sheet carrier density of the two dimensional electron gas formed at an interface of said gate side region with the electron running layer becomes between $2 \times 10^{12}$ $cm^{-2}$ and $4 \times 10^{12}$ $cm^{-2}$.

6. A field effect transistor formed of a semiconductor of a III group nitride compound, comprising:
    an electron running layer formed on a substrate and formed of GaN;
    an electron supplying layer formed on the electron running layer and formed of $Al_xGa_{1-x}N$ ($0.01 \leq x \leq 0.4$), said electron supplying layer having a band gap energy different from that of the electron running layer and being divided with a recess region having a depth reaching the electron running layer;
    a source electrode and a drain electrode formed on the electron supplying layer with the recess region in between;

a gate insulating film layer formed on the electron supplying layer for covering a surface of the electron running layer in the recess region; and a gate electrode formed on the gate insulating film layer in the recess region, wherein said electron supplying layer under the drain electrode comprises a plurality of regions having a composition ratio of Al decreasing from the drain electrode toward the gate electrode.

7. The field effect transistor according to claim 1, wherein said electron supplying layer has a layer thickness not smaller than 5.5 nm and not greater than 40 nm.

8. The field effect transistor according to claim 1, wherein said electron supplying layer includes, outside the recess region and between the drain electrode and the gate electrode, a step structure formed of not more than three steps, said step structure having a thickness decreasing from the drain electrode toward the gate electrode.

9. The field effect transistor according to claim 8, wherein the gate electrode is positioned at least partially co-elevational with a lowermost step of said step structure.

10. The field effect transistor according to claim 8, wherein the gate electrode is at least partially positioned within the recess region.

11. The field effect transistor according to claim 8, wherein said step structure includes
 a drain side region on a side of the drain electrode and defining a higher step of said step structure, and
 a gate side region on a side of the gate electrode and having a thickness smaller than that of the drain side region to define a lower step of said step structure,
 the thickness of said drain side region being such that a sheet carrier density of a two dimensional electron gas formed at an interface of said drain side region with the electron running layer becomes between $6 \times 10^{12}$ cm$^{-2}$ and $8 \times 10^{12}$ cm$^{-2}$, and
 the thickness of said gate side region being such that the sheet carrier density of the two dimensional electron gas formed at an interface of said gate side region with the electron running layer becomes between $2 \times 10^{12}$ cm$^{-2}$ and $4 \times 10^{12}$ cm$^{-2}$.

12. The field effect transistor according to claim 1, wherein said electron supplying layer under the drain electrode comprises a plurality of regions having a composition ratio of Al decreasing from the drain electrode toward the gate electrode.

13. The field effect transistor according to claim 4, wherein said electron supplying layer has a layer thickness not smaller than 5.5 nm and not greater than 40 nm.

14. The field effect transistor according to claim 4, wherein said step structure is positioned outside the recess region and between the drain electrode and the gate electrode.

15. The field effect transistor according to claim 14, wherein the gate electrode is positioned at least partially co-elevational with a lowermost step of said step structure.

16. The field effect transistor according to claim 15, wherein the gate electrode is at least partially positioned within the recess region.

17. The field effect transistor according to claim 16, wherein the recess region extends into a partial thickness of the electron running layer.

18. The field effect transistor according to claim 6, wherein said electron supplying layer has a layer thickness not smaller than 5.5 nm and not greater than 40 nm.

19. The field effect transistor according to claim 6, wherein the regions having the composition ratio of Al decreasing from the drain electrode toward the gate electrode are of substantially the same thickness.

\* \* \* \* \*